United States Patent [19]

Mizutani et al.

[11] Patent Number: 5,446,239
[45] Date of Patent: Aug. 29, 1995

[54] SHIELDED FLAT CABLE

[75] Inventors: Kenji Mizutani; Kazuhito Saka, both of Yokkaichi, Japan

[73] Assignee: Sumitomo Wiring Systems, Ltd., Japan

[21] Appl. No.: 138,331

[22] Filed: Oct. 15, 1993

[30] Foreign Application Priority Data

Oct. 19, 1992 [JP] Japan ............................. 4-078882 U

[51] Int. Cl.$^6$ ................................................ H01B 7/34
[52] U.S. Cl. .................................. 174/36; 174/117 F; 174/117 FF
[58] Field of Search ................ 174/36, 117 F, 117 FF

[56] References Cited

U.S. PATENT DOCUMENTS

| | | | |
|---|---|---|---|
| 3,612,744 | 10/1971 | Thomas | 174/36 |
| 3,934,075 | 1/1976 | Dilliplane | 174/75 |
| 4,481,379 | 11/1984 | Bolick et al. | 174/36 |
| 4,488,125 | 12/1984 | Gentry et al. | 174/115 |
| 4,513,170 | 4/1985 | Apodaca | 174/36 |
| 4,596,897 | 6/1986 | Gruhn | 174/36 |
| 4,616,102 | 10/1986 | Noorily | 174/36 |
| 4,678,864 | 7/1987 | Cox | 174/36 |
| 4,698,457 | 10/1987 | Bordbar | 174/36 |
| 5,008,490 | 4/1991 | Strauss et al. | 174/36 |

FOREIGN PATENT DOCUMENTS

| | | | |
|---|---|---|---|
| 145011 | 6/1991 | Japan | 174/36 |
| 33211 | 2/1992 | Japan | |
| 51722 | 4/1992 | Japan | |
| 55712 | 5/1992 | Japan | |

*Primary Examiner*—Morris H. Nimmo
*Attorney, Agent, or Firm*—Jordan B. Bierman; Bierman and Muserlian

[57] ABSTRACT

This invention permits reduction in space between conductors in a shielded flat cable, as well as improvement in shielding ability and cost savings of the shielded flat cable. The shielded flat cable comprises a cable body 8 including a base film 3, circuit conductors 1, and a ground conductor 2. The circuit conductors 1 are disposed in the upper surface of the base film 3 in a parallel relationship with one another. A lower cover layer film 4B is attached to the upper surface of the base film 3. The ground conductor 2 is disposed on the lower cover layer film 4B in a parallel relationship with the circuit conductors 1. An upper cover layer film 4A is placed over the ground conductor 2 and the lower cover layer film 4B. An area 7 having no upper cover layer film 4A is provided in the cable body. The area 7 having a predetermined width extends transversely of the cable body 8. A shield tape 5 is wrapped around the cable body so as to shield the cable body. The ground conductor 2 and the shield tape 5 are electrically connected with each other in surface-to-surface contact through the area 7 having no upper cover layer film.

4 Claims, 7 Drawing Sheets

SHIELDED FLAT CABLE

BACKGROUND OF THE INVENTION

1. Field of the Invention

This invention relates to shielded flat cables in the form of a flexible strip including conductors and films attached to the conductors in the upper and lower surfaces thereof. Such flat cables are used to perform electrical wiring for various equipment or instruments in order to prevent leakage of electromagnetic waves exteriorly from the conductors inside the flat cable, or to prevent adverse effect of electromagnetic waves.

2. Statements of Prior Art

Numeral types of shielded flat cables are known in the art. For example, Japanese Patent Public Disclosure No. 4-33211, and Japanese Utility Model Publication No. 4-51712 disclose grounding constructions for circuit conductors and ground conductors juxtaposed therewith. Such grounding constructions may be classified into two types as summarized below.

For convenience of illustration, shielded flat cables in prior art will be explained below with reference to FIGS. 7 through 10.

Figure 7:
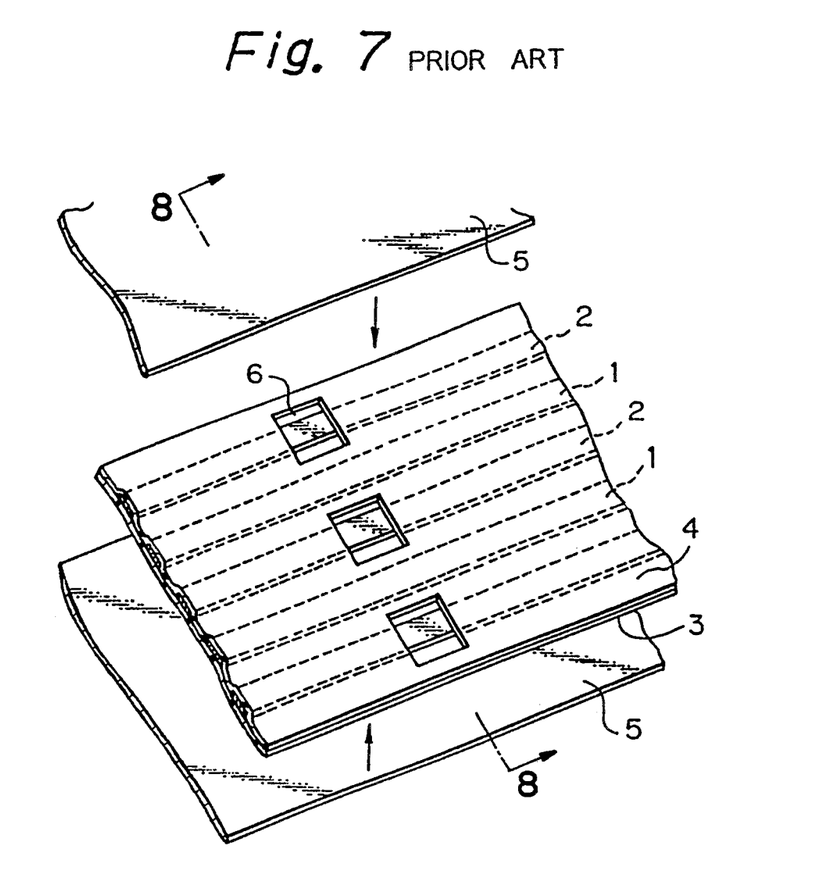
FIG. 7 is an exploded view showing a shielded flat cable in prior art.
Figure 8:
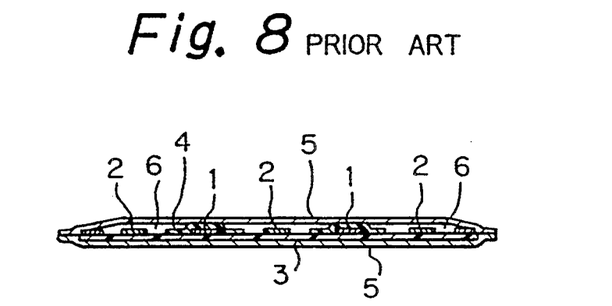
FIG. 8 is an enlarged cross-sectional view along line 8—8 in FIG. 7.
Figure 9:
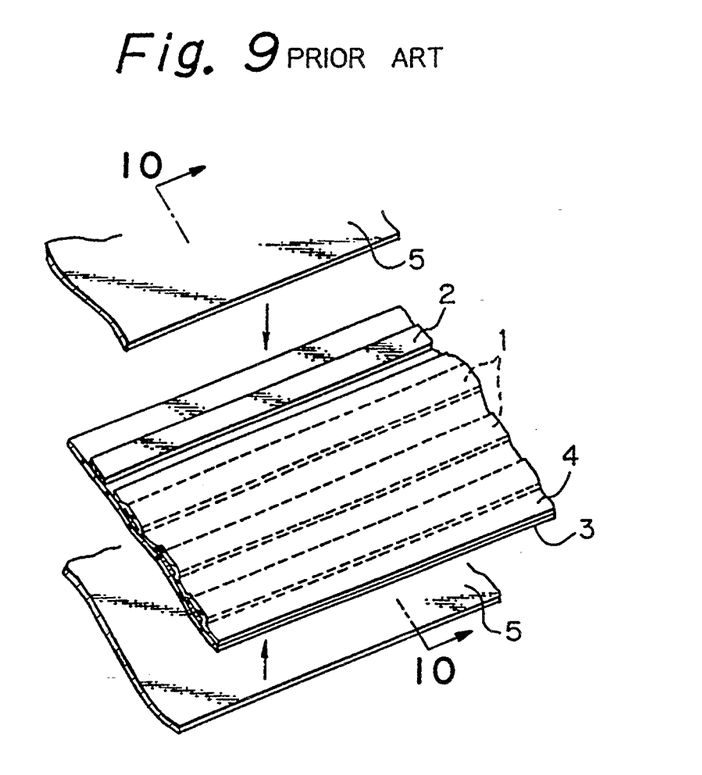
FIG. 9 is an enlarged perspective view showing another shielded flat cable in prior art.
Figure 10:
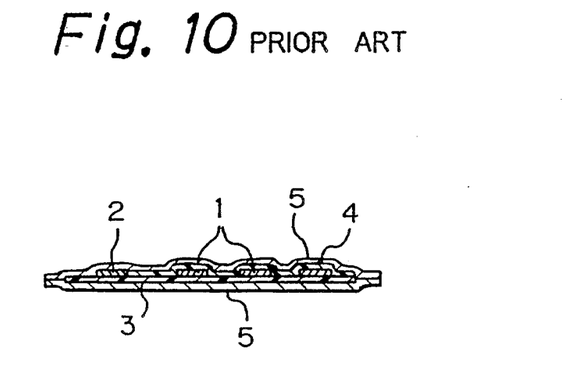
FIG. 10 is an enlarged cross-sectional view along line 10—10 in FIG. 9.

FIG. 7 is an exploded perspective view of a shielded flat cable in prior art. FIG. 8 is a cross-sectional view along line 8—8 of FIG. 7. FIG. 9 is an exploded perspective view of an another shielded flat cable in prior art. FIG. 10 is a cross-sectional view along line 10—10 of FIG. 9.

One example of the flat cables in the prior art includes, as shown in FIGS. 7 and 8, circuit conductors 1 and ground conductors 2 which are alternately juxtaposed on a base film 3. A cover layer film 4 is adhesively placed over the conductors 1, 2, so that the conductors are sandwiched in between the base film 3 and the cover layer film 4. Several portions of the cover layer film 4 are cut out to form small connection windows 6 through which the ground conductors 2 are exteriorly exposed. A pair of shield tapes 5 of a conductive metal foil are attached to the outer surfaces of the cover layer film 4 and base film, respectively, so as to shield the cable. The portions of the ground conductors 2 exposed through the connection windows are conductively connected to the shield tape 5 by means of junction, deposition, welding or the like for the purpose of grounding, while, on the other hand, the circuit conductors 1 are electrically insulated from the shield tape 5 by means of the cover layer film 4.

The other type of shielded flat cable includes, as shown in FIGS. 9 and 10, a plurality of circuit conductors 1 juxtaposed on a base film 3, and a ground conductor 2 disposed on one side of the circuit conductors in parallel relationship with the circuit conductors. A cover layer film 4 is adhesively attached to the base film 3 so that it covers the circuit conductors 1, but not the ground conductor 2. A pair of shield tapes 5 are adhesively connected to the cover layer film 4 and base film 3 for the purpose of shielding. The ground conductor 2, not covered with the cover layer film 4, is conductively connected and grounded to the shield tape 5.

With the first mentioned flat cable, it is difficult and time consuming to form small connection windows 6 in the intermediate portion of the cover layer film 4. Formation of such connection windows becomes Impossible in substance when it is intended to make the spaces between the conductors narrower. By this, spaces between the conductors are limited to an amount above a predetermined value. Thus, this type of flat cable is disadvantageous, since it does not meet the requirement in the art in view of miniaturization and cost savings of the flat cables. It is also noted that a space does exist between the ground conductors 2 in the area of the connection windows and the shield tape 5, the space corresponding to the thickness of the cover layer film 4. Thus, it is difficult to perform soldering work for electrically connecting the ground conductors 2 to the shield tape 5. A large amount of soldering material is required. Reliability in electrical connection between the ground conductors and the shield tape is not sufficient, since such electrical connection is made by means of soldering material filled in the above space.

With the secondly mentioned shielded flat cable in prior art, the ground conductor, 2 exposed exteriorly along the length thereof, may be directly connected to the shield tape 5. Thus, the "less workability", "limitation in the space between the conductors", and "less reliability in electrical connection", due to the presence of the connection windows 6, mentioned above may be eliminated. It is noted, however, that sufficient "shield effect" cannot be obtained since the ground conductor 2 is distant from the circuit conductors 1.

SUMMARY OF THE INVENTION

The main object of the invention is to provide a shielded flat cable which enables reduction in space between the conductors, improvement in shielding ability, and cost savings.

In order to achieve the above object, the invention provides a flexible, shielded flat cable having a basic construction which comprises a base film, a plurality of strips of circuit conductor Juxtaposed on the base film, a strip of ground conductor arranged in parallel with the strips of circuit conductor, a cover layer film attached to the strips of circuit conductor and ground conductor, and a shield tape of a conductive metal foil, made for example of aluminum, copper or the like, extending over the cover layer film, the ground conductor being conductively connected to the shield tape, wherein the cover layer film is of a double layered construction comprised of an upper cover layer film having an area provided with no upper layer film therein, and a lower cover layer film, and wherein the ground conductor is exposed, through the area provided with no upper layer film, to the shield tape so as to be connected with the shield tape.

A shielded flat cable according to a first embodiment is characterized by a construction wherein the lower cover layer film is placed over the base film provided, in the upper surface thereof, with the circuit conductors juxtaposed thereon, the ground conductor is disposed on the lower cover layer film in parallel relationship with the circuit conductors, and the upper cover layer film is placed over the lower cover layer film and the upper surface of the ground conductor so as to form a cable body, wherein the cable body is provided, at predetermined locations thereof, with areas having no upper cover layer film which extend transversely of the cable body, wherein the shield tape is placed over the surface of the cable body including the areas having no upper cover layer film so as to shield the cable body, and wherein the ground conductor and the shield tape are conductively connected with each other through the areas having no upper cover layer film.

A shielded flat cable according to a second embodiment is characterized by a construction wherein the lower cover layer film of a predetermined size is placed over the base film at a predetermined location thereof so as to electrically insulate the upper surface of the circuit conductors, the circuit conductors being provided in the upper surface of the base film, the ground conductor is disposed on the lower cover layer film, the ground conductor being arranged in parallel with the circuit conductors, and the upper cover layer film is placed over the base film in an area including the upper surfaces of the ground conductor and the lower cover layer film so as to form a cable body, wherein an area having no upper cover layer film is provided which extends along the intermediate portion of the lower cover layer film and transversely of the cable body, wherein the shield tape is attached to the surface of the cable body including the area having no upper cover layer film so as to shield the cable body, and wherein the ground conductor and the shield tape is conductively connected with each other through the area having no upper cover layer film.

The shielded flat cable according to the invention brings about several advantages as mentioned below.

According to the first embodiment of the invention, the cover layer film is comprised of a lower cover layer film and an upper cover layer film. A ground conductor is disposed between the lower and upper cover layer films. An area having no upper cover layer film is provided. The ground conductor and the shield tape serving as a surface layer of the flat cable is electrically connected with each other through the area having no upper cover layer film. Thus, the circuit conductors and the ground conductor may be electrically insulated relative one another by means of the lower cover layer film. The circuit conductors and the ground conductor are separated from one another by the lower cover layer film and hence do not lie in the same plane. Accordingly, it is possible to reduce spaces between the conductors.

The ground conductor and the shield tape may be electrically connected with each other through the area having no upper cover layer film, without the use of connection windows in the prior art. Thus, it is possible to electrically connect the ground conductor with the shield tape in surface-to-surface contact, so that performance in electrical connection therebetween is improved. Operation of electrically connecting the ground conductor with the shield tape is also facilitated.

According to the second embodiment of the invention, the lower cover layer film is comprised of two layers of cover layer films solely disposed in areas in which the ground conductor is electrically connected to the shield tape. Thus, the ground conductor is disposed on the base film in an area where no lower cover layer film is provided. On the other hand, and in an area where the lower cover layer is provided, the circuit conductors and the ground conductor are electrically insulated from one another by means of the lower cover layer film.

The area having no upper cover layer film, as in the case of the first embodiment, constitutes a connection portion. Thus, connection windows in the prior art may be obviated. The performance in electrical connection between the ground conductor and the shield tape is improved due to the surface-to-surface contact therebetween. The operation of electrically connecting the ground conductor and the shield tape is also facilitated.

In both the first and second embodiments, the lower cover layer film and/or the upper cover layer film are disposed between the circuit conductors and the shield tape, so that the circuit conductors are securely insulated from the ground conductor. It is also possible to arrange the circuit conductors and the ground conductor(s) in alternate fashion relative to one another. Accordingly, reduction in shielding effect due to the limitation in arrangement of the ground conductor(s) may be prevented.

BRIEF DESCRIPTION OF THE DRAWINGS

FIGS. 2A and B are enlarged cross-sectional views along lines 2A—2A and 2B—2B of FIG. 1, respectively, in which FIG. 2A shows the area of the flat cable having no upper cover layer film therein, and FIG. 2B shows the area of the flat cable having upper cover layer film;

DETAILED DESCRIPTION OF THE PREFERRED EMBODIMENTS

Several embodiments of a shielded flat cable according to the invention will be explained below with reference to FIGS. 1 through 6.

Figure 1:
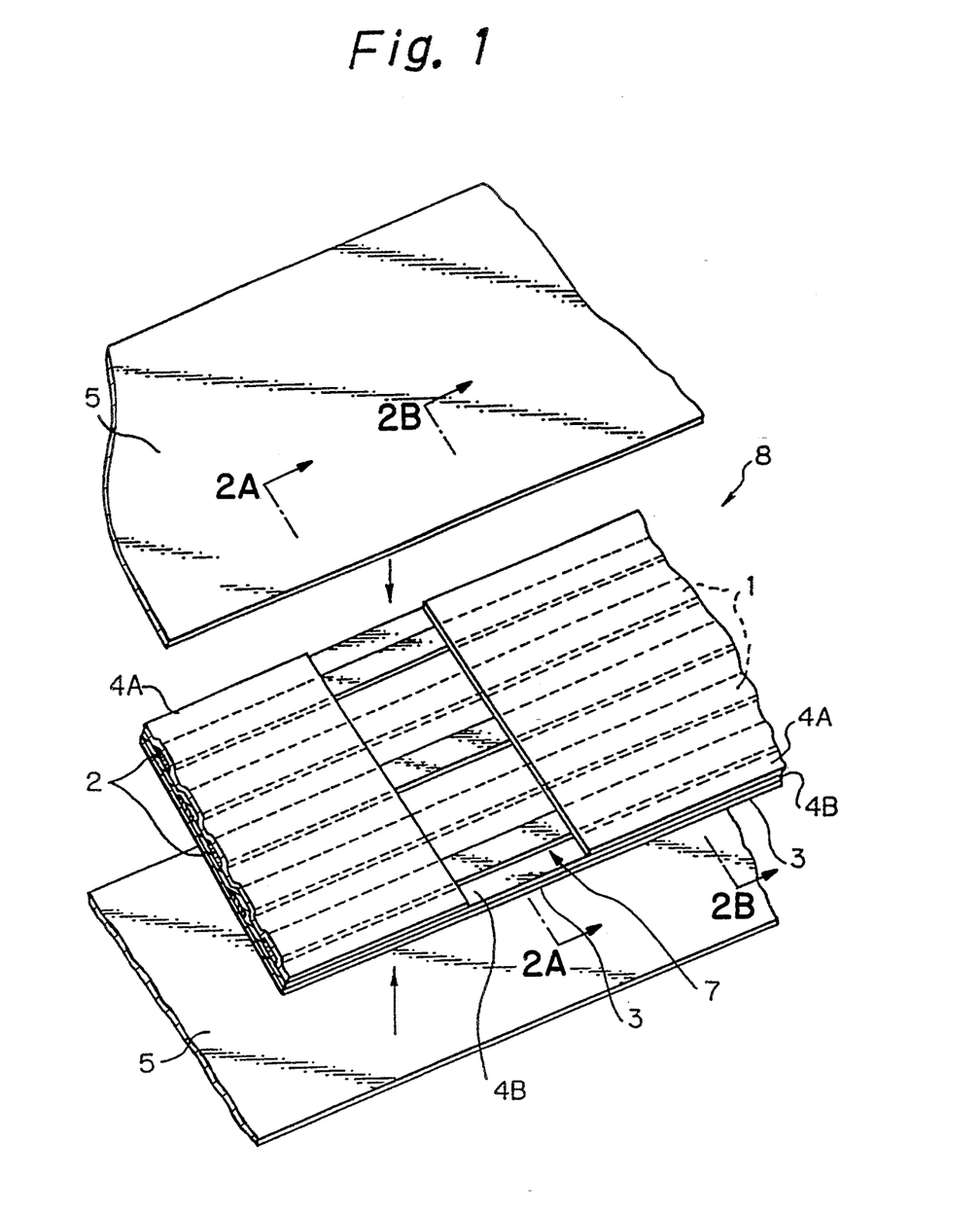
FIG. 1 is a perspective view illustrating the construction of a shielded flat cable according to a first embodiment of the invention.
Figure 2A:
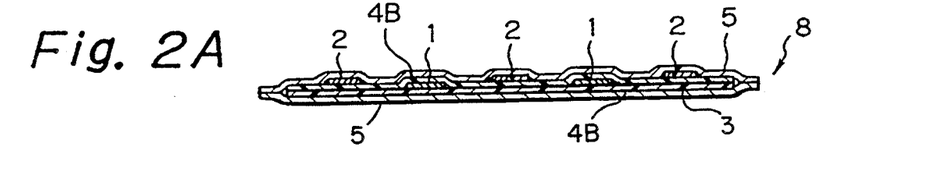
Figure 2B:
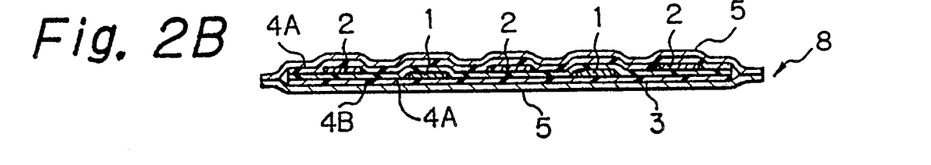
Figures 3A, 3B:
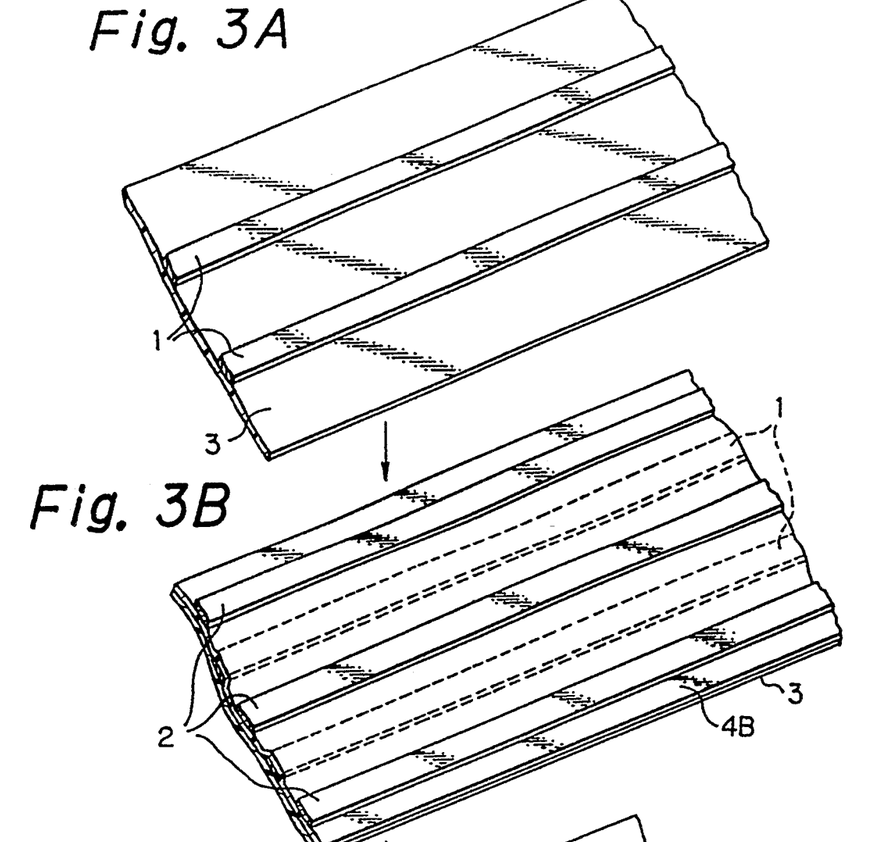
FIGS. 3A-3C are Illustrative views showing a process of forming the flat cable according to the first embodiment.
Figure 3C:
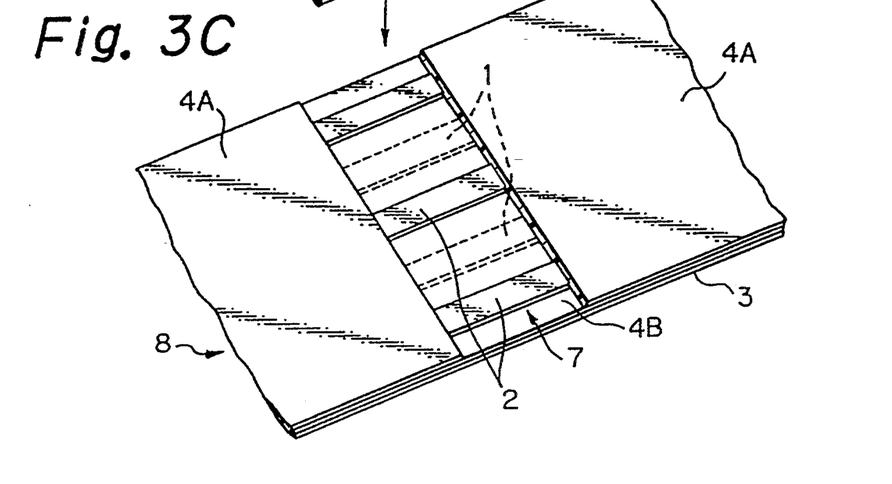

FIGS. 1 through 3 illustrate a flexible flat cable according to a first embodiment of the invention. The flat cable of a web-like configuration includes circuit conductors 1 of a web-like configuration Juxtaposed on a base film 3, and ground conductors 2 of a web-like configuration disposed on the base film 3 in parallel relationship with the circuit conductors 1. The conductors 1, 2 are covered with a cover layer film 4. A pair of shield tapes 5 of a conductive metal foil, made of aluminum, copper, for example, are shieldingly attached to the cover layer film 4, so that the ground conductors 2 and the shield tapes 5 are conductively connected. The cover layer film 4 is of a double layered construction Including an upper cover layer film 4A and a lower cover layer film 4B.

A plurality of circuit conductors i are disposed on the base film 3 in a juxtaposed fashion (FIG. 3A). The lower cover layer film 4B is adhered onto the circuit conductors 1 (FIG. 3B). The ground conductors 2 are disposed on the lower cover layer film 4B, so that the ground conductors 2 extend in parallel with the circuit conductors and appear alternatively with the circuit conductors 1 (FIG. 2B). The upper cover layer film 4A is adhered onto the surface of the lower cover film 4B and the upper surface of the ground conductors (FIG. 3C). Thus, the base film 3 and cover layer films 4A, 4B constitute a cable body 8 in which the circuit conductors 1 and the ground conductors 2 are encased.

The cable body 8 includes a connection part 7 through which the ground conductors 2 are to be conductively connected with the shield tape 5. Specifically, the connection part 7 may be determined as an area of a predetermined width extending transversely of the cable body 8 in which no upper cover layer film 4A is provided, as shown in FIG. 3C. The shield tapes 5, 5 are attached to the upper surface, including the area of the connection part 7, and the lower surface of the cable body 8, respectively. Thus, the cable body 8 is shielded by means of the shield tapes 5, 5 in its entirety. It is to be noted, however, the ground conductors 2 may be conductively connected and grounded to the shield tape 5 through the connection part 7 by means of appropriate means, such as Junction, deposition, welding or the like (see FIG. 2A).

Thus, at the connection part 7 in which no upper cover layer film 4A is provided, the ground conductors 2 are conductively connected to the shield tape 5, while the circuit conductors 1 are electrically insulated from the shield tape 5 and ground conductors 2 by means of the lower cover layer film 4B (see FIG. 2A). On the other hand, at the non-connection part in which the upper cover layer film 4A is provided, the circuit conductors 1 are electrically insulated by means of the two cover layer films 4A, 4B, and the ground conductors 2 are insulated by means of the single cover layer film 4A (see FIG. 2B).

Figure 4:
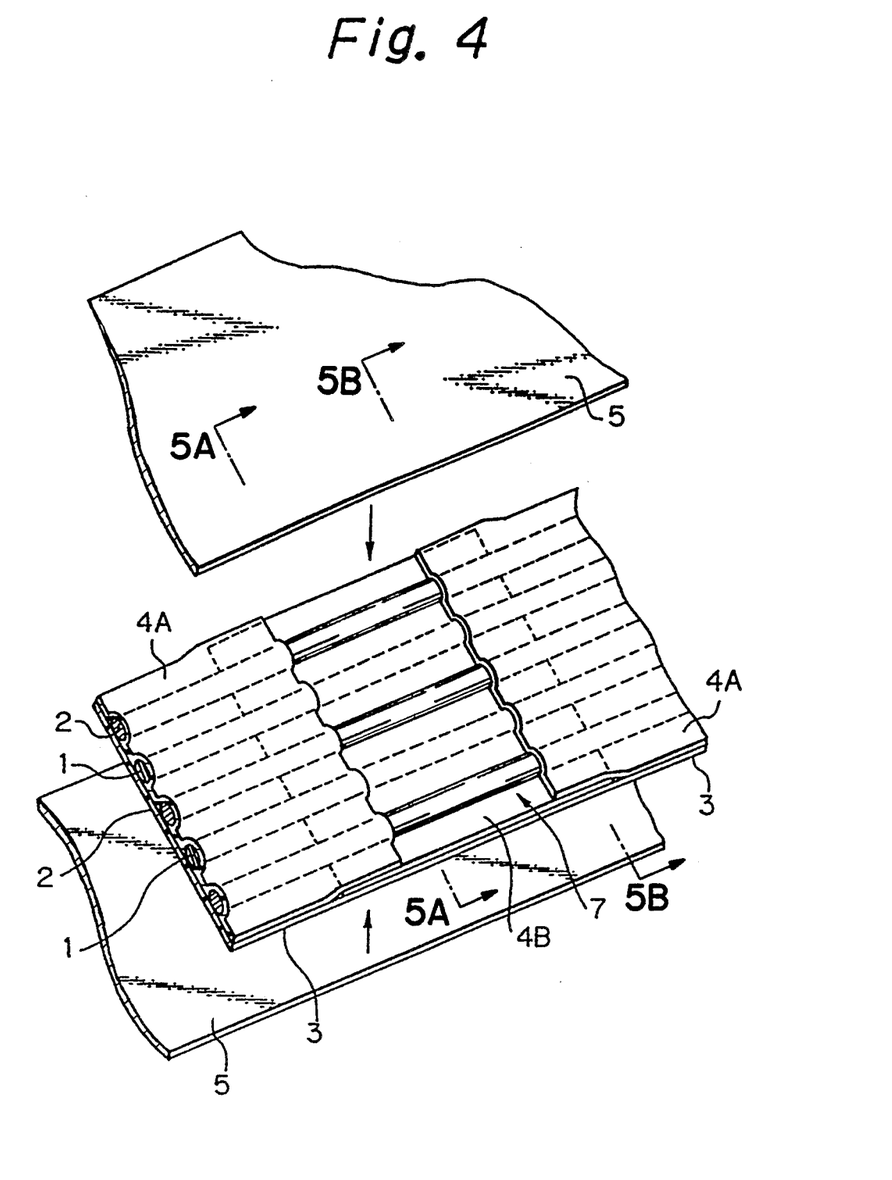
FIG. 4 is an enlarged perspective view illustrating construction of a shielded flat cable according to a second embodiment.
Figure 5A:
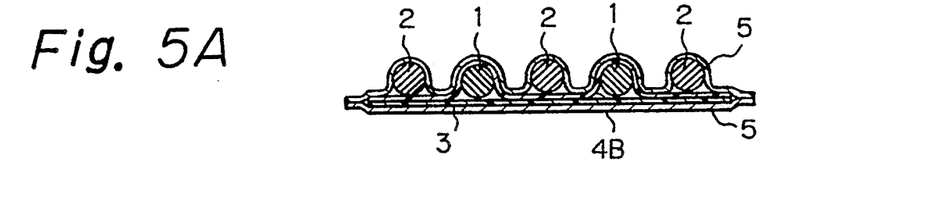
FIGS. 5A and 5B are enlarged cross-sectional views along lines 5A—5A and 5B—5B, respectively, of FIG. 4, showing the area of the flat cable having no upper cover layer film, and the area of the flat cable having upper cover layer film, respectively.
Figure 5B:
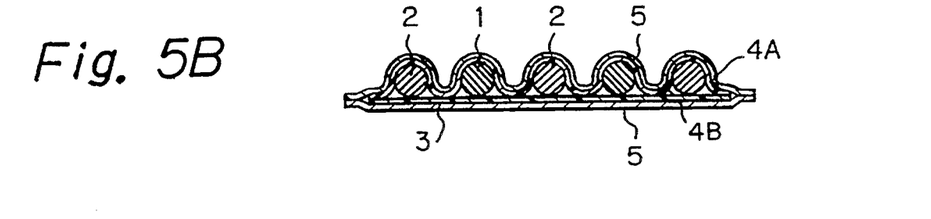

A second embodiment of a flat cable according to the invention will be explained below with reference to FIGS. 4 through 6.

The shielded flat cable of the second embodiment includes rounded circuit conductors 1 and rounded ground conductors 2. The circuit conductors 1 and ground conductors 2 are disposed on a base film 3 in a juxtaposed fashion and sandwiched between the base film 3 and a cover layer film 4. The flat cable also includes a shield tape 5 provided therearound for shielding purpose. The cover layer film 4 is partially of a double layered construction including a upper cover layer 4A on a limited portion of the base film 3 and an extending entirely on the base film 3.

Figure 6A:
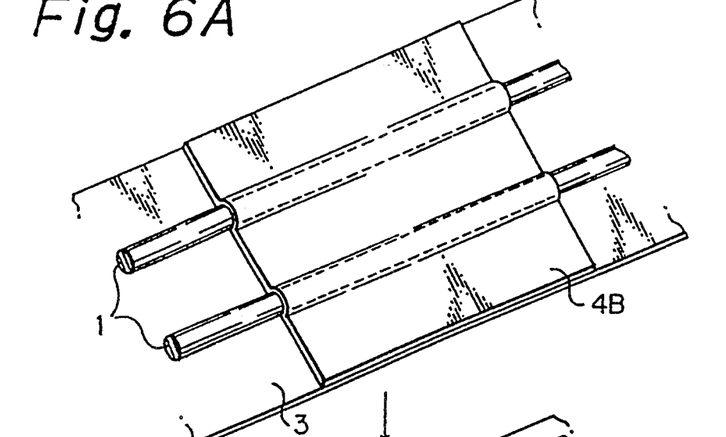
FIGS. 6A-6C are illustrative view showing a process of forming the embodiment shown in FIG. 4.
Figure 6B:
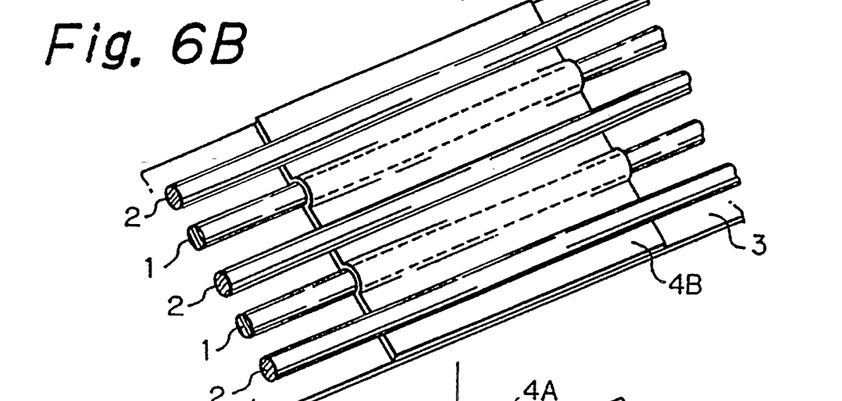
Figure 6C:
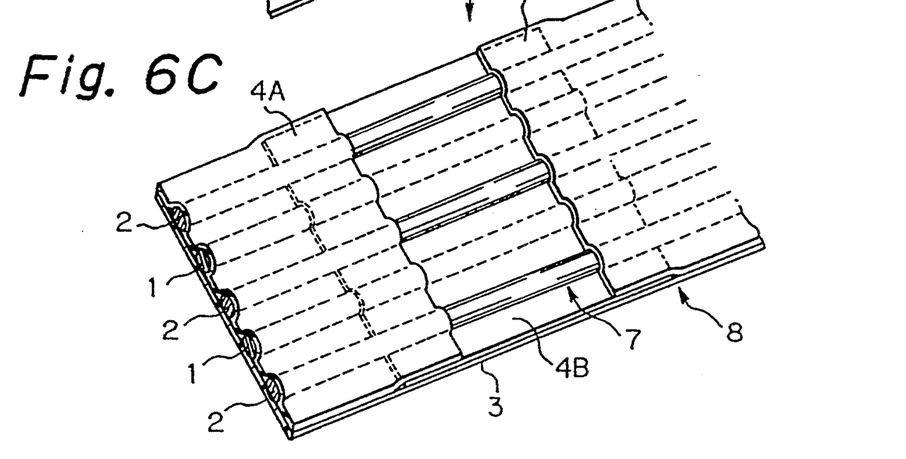

More specifically, and as shown in FIG. 6A, the lower cover layer film 4B of a predetermined size is provided at an intermediate portion of the base film 3 (corresponding to the connection part in the first embodiment through which the ground conductors 2 are conductively connected with the shield tape 5). The lower cover layer film 4B extends over the circuit conductors 1 so as to electrically insulate the upper surface of the circuit conductors. The ground conductors 2, disposed in parallel with and alternately with the circuit conductors 1, are extended over the lower cover layer film 4B and the area of the base film 3 at which no lower cover layer film 4B is provided (see FIG. 6B). The upper cover layer film 4A is adhesively attached to the upper surface of the ground conductors 2 and the upper surface of the base film 3, including the upper surface of the lower cover layer film 4B (see FIG. 6C). Thus, the base film 3 and cover layer films 4A, 4B forms a cable 8 with the conductors being sandwiched between the base film and the cover layer films. The cable body 8 includes an area 7 having no upper cover layer film 4A therein, the area having no upper cover layer film being positioned at an intermediate portion of the lower cover layer film 4B. The area having no upper cover layer film is of a web-like configuration and extends transversely of the cable body 8 (see FIG. 6C).

The cable body 8, as in the first embodiment, is provided, at the upper and lower surface thereof, with shield tapes 5 for shielding the cable body 8 in its entirety. The cable body also has a grounded construction in which the ground conductors 2, exposed in the area 7 having no upper cover layer film, are conductively connected to the shield tape 5. In the embodiment shown in FIG. 4, the area 7 having no upper cover layer film takes a construction the same as that of the area 7 having no upper cover layer film of the embodiment shown in FIG. 1 (see FIG. 5A). On the other hand, the flat cable of FIG. 4 takes, at an area having no lower cover layer film 4B, a construction in which the circuit conductors 1 and ground conductors 2 on the base film 3 are electrically insulated from the shield tapes 5 by means of the single upper cover layer film 4A.

The shielded flat cables according to the above embodiments have several advantages as noted below. The present flat cable does not need connection windows in the prior art which make it difficult to reduce the space between the conductors. This advantageously makes it possible to reduce the space between the conductors. The area 7 having no upper cover layer film, which takes place of the connection windows in the prior art, may be easily obtained when no upper cover layer film 4A is attached to that portion. Thus, the ground conductors 2 and the shield tape 5 are easily connected together. It is also noted that the ground conductors 2 and the shield tape 5 may be joined together in surface-to-surface relationship.

It should be noted that the present invention is not limited to the above embodiments. For example, the ground conductors 2 and the circuit conductors 1 may be arranged in a suitable manner other than the alternate arrangement mention above. The conductors may be arranged in a nonlinear fashion. The shield tape 5 may be attached to either one of the upper and lower surface of the cable body. The shield tape may be attached to a portion or portions of one or both surface of the cable body. The ground conductors 2 and the shield tape may be connected together at suitable portion other than that of the above embodiments. The first embodiment may include rounded conductors. Likewise, the second embodiment may include web-like conductors. The lower cover layer film 4B in the second embodiment does not necessarily extend full width of the base film 3. It is sufficient for the lower cover layer film 4B to extend continuous length or discrete lengths so as to electrically insulate the upper surface of the circuit conductors 1. Such changes or modifications fall within the scope of the present invention.

As explained above, the flat cable of the invention permits reduction of spaces between the conductors, so as to satisfy the requirement of miniaturization in the art. The invention also permits surface-to-surface contact between the ground conductors and shield tape, so as to increase stability of performance in electrical connection and shielding ability. Furthermore, the invention increases workability during forming connection part between the ground conductors and shield tape and during connecting the ground conductors with the shield tape.

What is claimed is:

1. A flexible, shielded flat cable comprising a base film, a plurality of strips of circuit conductors thereon, a strip of a ground conductor in parallel with said strips of circuit conductors, a cover layer film attached to said strips of circuit conductors and said ground conductor, and a shield tape of a conductive metal foil extending over said cover layer film, wherein said cover layer film is of a double layered construction comprised of an upper cover layer film having an area provided with no upper layer film therein, and a lower cover layer film, and wherein said ground conductor is exposed through said area, to said shield tape so as to be connected with said shield tape, said lower cover layer film being over said base film and provided on an upper surface thereof, with said circuit conductors, said ground conductor disposed on said lower cover layer film, said upper cover layer film on said lower cover layer film and on said upper surface of said ground conductor thereby to form a cable body, there being a plurality of said areas at predetermined locations on said body, said shield tape being on the surface of said cable body including said areas to shield said cable body, and said ground conductor and said shield tape being conductively connected with each other through said areas.

2. The cable of claim 1 wherein said metal foil is of aluminum, copper, or the like.

3. A flexible, shielded flat cable comprising a base film, a plurality of strips of circuit conductors thereon, a strip of a ground conductor in parallel with said strips of circuit conductors, a cover layer film attached to said strips of circuit conductors and said ground conductor, and a shield tape of a conductive metal foil extending over said cover layer film, wherein said cover layer film is of a double layered construction comprised of an upper cover layer film having an area provided with no upper layer film therein, and a lower cover layer film, and wherein said ground conductor is exposed through said area, to said shield tape so as to be connected with said shield tape, said lower cover layer film of a predetermined size is on said base film of a predetermined location thereof to electrically insulate an upper surface of said circuit conductors, on an upper surface of said base film, said ground conductor on said lower cover layer film, and said upper cover layer film is on said base film in said area including the upper surfaces of said ground conductor and said lower cover layer film to form a cable body, wherein said area extends along an intermediate portion of said lower cover layer film and transversely of said cable body, wherein said shield tape is attached to the surface of said cable body including said area to shield said cable body, wherein said ground conductor and said shield tape are conductively connected with each other through said area.

4. The cable of claim 3 wherein said metal foil is of aluminum, copper, or the like.

* * * * *